United States Patent
Kinney (10) Patent No.: US 10,784,199 B2
(45) Date of Patent: Sep. 22, 2020

(54) COMPONENT INTER-DIGITATED VIAS AND LEADS

(71) Applicant: Micron Technology, Inc., Boise, ID (US)

(72) Inventor: Christopher Kinney, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/280,570

(22) Filed: Feb. 20, 2019

(65) Prior Publication Data

US 2020/0265871 A1 Aug. 20, 2020

(51) Int. Cl.
*H01L 23/528* (2006.01)
*G11C 5/06* (2006.01)
*H01L 23/522* (2006.01)

(52) U.S. Cl.
CPC ........... *H01L 23/5286* (2013.01); *G11C 5/06* (2013.01); *H01L 23/5226* (2013.01); *H01L 23/5227* (2013.01)

(58) Field of Classification Search
CPC ............ H01L 23/5286; H01L 23/5226; H01L 23/5227; H01L 25/065; H01L 25/0652; H01L 25/0655; H01L 25/0657; H01L 25/07; H01L 25/071; H01L 25/072; H01L 25/073; H01L 25/074
See application file for complete search history.

(56) References Cited

U.S. PATENT DOCUMENTS

| | | | |
|---|---|---|---|
| 7,013,436 B1 * | 3/2006 | Morton | H01L 23/5286 257/532 |
| 7,863,091 B2 * | 1/2011 | Coteus | G11C 5/04 438/106 |
| 2007/0029661 A1 * | 2/2007 | Beddingfield | H01L 23/5286 257/691 |
| 2013/0087366 A1 * | 4/2013 | Michael | H01L 24/05 174/252 |
| 2017/0229322 A1 * | 8/2017 | Hsu | H01L 21/565 |
| 2018/0235077 A1 * | 8/2018 | Oh | H05K 1/0216 |

* cited by examiner

*Primary Examiner* — Scott B Geyer
(74) *Attorney, Agent, or Firm* — Schwegman Lundberg & Woessner, P.A.

(57) ABSTRACT

Aspects of the present disclosure are directed to systems and methods to reduce inductance on an integrated circuit package of a memory sub-system. A memory sub-system is also hereinafter referred to as a "memory device." An example of a memory sub-system is a storage system, such as a SSD, and can be embodied as an integrated circuit package, including but not limited to a pin grid array (PGA), and ball grid array (BGA).

9 Claims, 5 Drawing Sheets

COMPONENT INTER-DIGITATED VIAS AND LEADS

TECHNICAL FIELD

Embodiments of the disclosure relate generally to memory sub-systems and, more specifically, to systems and methods to reduce inductance on an integrated circuit.

BACKGROUND

A memory sub-system can be a storage system, such as a Solid-State Drive (SSD), and can include one or more memory components that store data. The memory components can be, for example, non-volatile memory components and volatile memory components in the form of an integrated circuit package, including a pin grid array (PGA). In general, a device or host system can utilize the memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to systems and methods to reduce inductance on an integrated circuit package through an inter-digitated pin arrangement. Although the present disclosure may relate to any integrated circuit it is described herein, by way of example, with reference to a memory sub-system. A memory sub-system is also hereinafter referred to as a "memory device." An example of a memory sub-system is a storage system, such as a SSD, and can be embodied as an integrated circuit package, including but not limited to a pin grid array (PGA), single in-line package (SIP), standard or non-standard dual in-line package (DIP), ceramic dual in-line package (CDIP), quadruple in-line package (QIP), skinny dual in-line package (SDIP), zig-zag in-line package (ZIP), ceramic column-grid array (CCGA), column-grid array (CGA), lead-less lead-frame package (LLP), land grid array (LGA), low-temperature co-fired ceramic (LTCC), multi-chip module (MCM), Micro surface-mount device extended technology (MICRO SMDXT), quad flat package (QFP), small outline package (SOP), ball grid array (BGA), and chip-scale package (CSP). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Memory sub-systems, in the form of integrated circuits, have become common components in computer systems ranging from mobile phones to mission-critical server systems. As reliance upon these memory sub-systems increases, so does the need for improvements in performance of the components of those memory sub-systems. Demands on components have therefore results in increases in the area of an integrated circuit, while design constraints continually shrink physical dimensions of those same components. As a result, inductive effects within components have become a factor whose effect on performance must be managed by designers of such components, often resulting in compromises in overall component performance.

For example, components such as Not-And gates (NAND), Dynamic Random-Access Memory (DRAM), and SSD controllers transition from low power sleep states to high-power, high-performance states. Current passes through a power delivery network as it is delivered to the component. In traditional layouts, during a fast transition, the current passing through the delivery network creates inductance that momentarily reduces the voltage at the components themselves. Reduced voltage can cause device reset or data corruption. Existing techniques for mitigation of the reduction of voltage at the components require higher voltages (and consequently higher power).

The most common technique to address these inductive effects are the addition of shielding or buffers between signal lines in order to reduce noise. While such techniques are effective to reduce inductive effects in some situations, such solutions are not effective in reducing the inductive effects without significant comprises in other areas, such as increases in delay, component cost, and size.

Aspects of the present disclosure address the above and other deficiencies by providing systems and methods to reduce negative effects of inductance on components, and more specifically in components in a memory sub-system. Such components attach externally on the top and bottom of a substrate (described herein by way of example in the form of a printed circuit board) of a device. Vias are used, inter alia, to transition from external components to internal conductive layers of the printed circuit board. Voltage regulators and capacitors can be connected to components mounted to the printed circuit board (e.g., NAND, DRAM, and SSD controller), in order to improve power delivery and reduce noise.

This connection between the voltage regulators, capacitors, and components has an inherent geometry dependent inductance, where inductance forms an impedance to high speed switching directly proportional to both the speed and inductance magnitude. The impedance increases the voltage dropped across the connection, and consequently reduces the voltage at the component requiring power. Thus, reducing inductance reduces the voltage drop and increases the voltage at the component.

Example embodiments described herein address the problem of the negative effects inductance has on components using inter-digitation. Inter-digitation includes the interlocking or linking of components or elements, resembling the interlinking of fingers of two hands being locked together. For example, in the context of vias and leads, an inter-digitation of power vias and ground vias can be represented as an alternating arrangement of power vias and ground vias. Accordingly, a power via is positioned adjacent to one or more ground vias. Aspects of the present disclosure apply the same or a similar approach to memory sub-systems and components, including but not limited to NAND, DRAM, and SSD controllers.

Such components are typically embodied in integrated circuit packages with standard lead configurations (e.g., Joint Electron Device Engineering Counsel (JEDEC) standard pin configurations), wherein the vias of the printed circuit board are configured to accept the leads of an integrated circuit package, such that positions of the vias correspond to positions of the leads on the integrated circuit package. Thus, signals can travel through vias and into its corresponding lead on the integrated circuit package, and vice versa. The integrated circuit packages include leads, such as pillars, pads, or pins, where each lead requires a corresponding via transition. Due to package lead density and via size, the via placements on the substrate are limited to locations near the corresponding leads of the components. However, for some other leads, there is some flexibility allowing the vias to be arranged in an inter-digitated fashion. When viewed in a two-dimensional top view, the vias appear in checkerboard pattern, where different colored blocks of the checkerboard correspond to power vias (e.g., red squares) and ground vias (black squares), respectively.

The basic mutual inductance principal is that currents flowing in opposite directions reduce mutual inductance, while current flowing in the same direction increases mutual inductance. The inter-digitated pattern applies this principal to reduce mutual inductance across the vias of integrated circuit packages. Thus, according to some example embodiments, power vias are placed adjacent to ground vias in an alternating power-ground. "checkerboard" pattern.

According to some example embodiments, a memory component of a memory sub-system may be configured such that a plurality of electrical contacts, including both power and ground component pins, protruding from a package of a memory component are arranged such that the power leads are inter-digitated among the ground leads. Similarly, a substrate is configured to receive the memory component by applying the same principal to power and ground vias distributed along the surface of the substrate. For example, the power and ground vias can be arranged such that the power vias are inter-digitated among the ground vias.

In some embodiments, the vias (and therefore also the corresponding leads) are arranged in an alternating inter-digitated pattern, such that a power via is immediately adjacent to and is preceded by a ground via, and likewise, a power lead is immediately adjacent to and is preceded by a ground lead. In further example embodiments, the vias are grouped together in pairs, such that a pair comprises a ground via and a power via, and wherein the vias of the pairs are a first threshold distance from one another, and any two pairs are a second threshold distance from one another. Leads of a memory component can be similarly arranged such that pairs of leads can be grouped in power and ground pairs, wherein the leads of the pair are threshold distances from one another.

Accordingly, the inter-digitation of vias in layouts as discussed above can result in a 22% reduction in effective inductance in power delivery networks, which translates to a 22% increase in performance (bandwidth). For example, in a non-inter-digitated layout, effective inductance may be calculated as:

$$L_{Original} = \frac{Z}{2\pi f} = \frac{0.09 \Omega}{2 \cdot \pi \cdot 0.1 \text{ GHz}} = 0.14 \text{ nH}$$

While a modified layout, implementing the inter-digitation techniques above, may be calculated as:

$$L_{Modified} = \frac{Z}{2\pi f} = \frac{0.07 \Omega}{2 \cdot \pi \cdot 0.1 \text{ GHz}} = 0.11 \text{ nH}$$

As seen above, there is a 22% reduction in effective inductance within a power delivery network utilizing inter-digitated component pins.

$$\text{Reduction} = 1 - \frac{L_{Modified}}{L_{Original}} = 1 - \frac{0.11 \text{ nH}}{0.14 \text{ nH}} = 22\%$$

Figure 1:
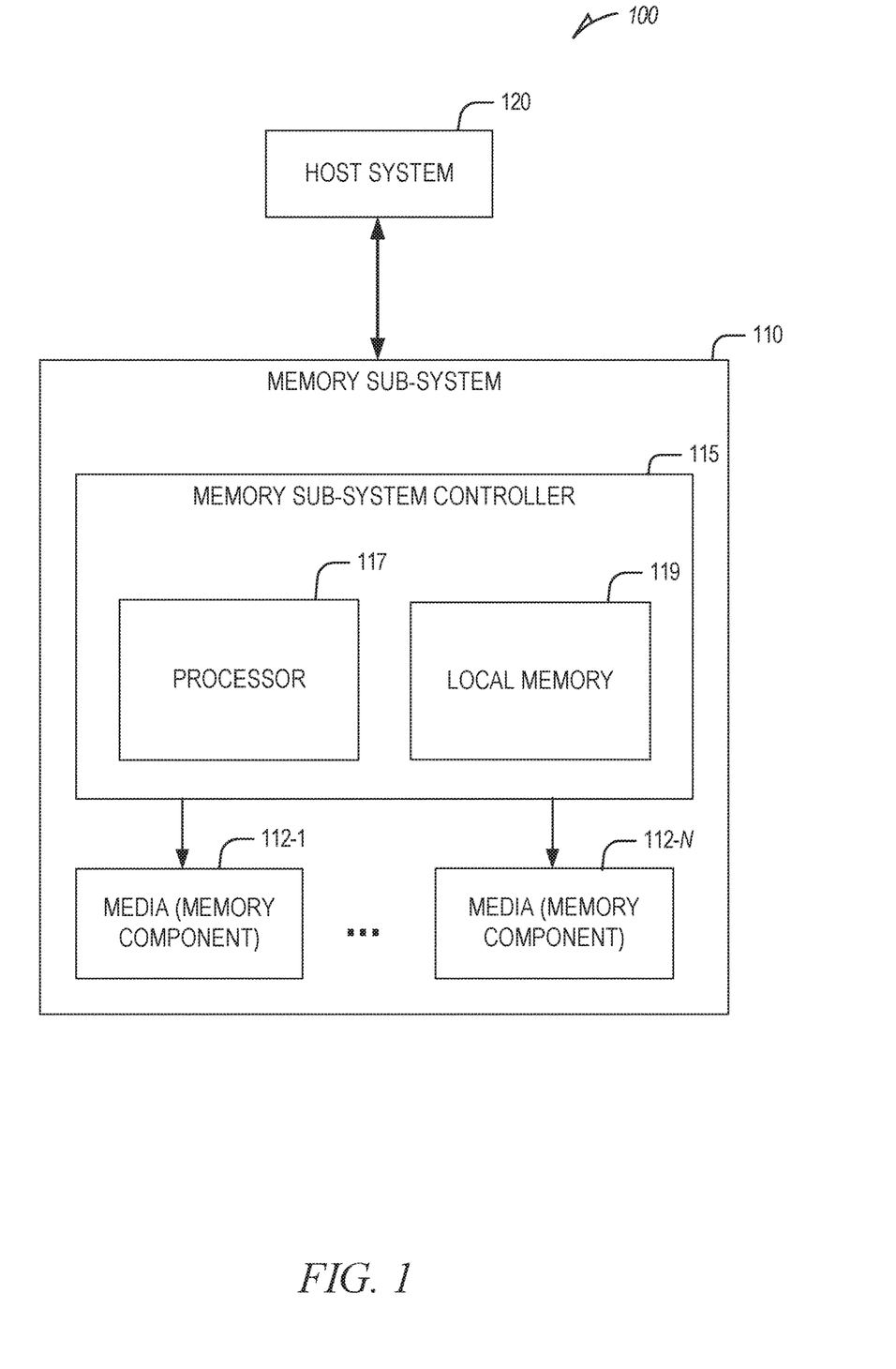
FIG. 1 illustrates an example computing environment that includes a memory sub-system, in accordance with some embodiments of the present disclosure.

FIG. 1 illustrates an example computing environment 100 that includes a memory sub-system 110, in accordance with some embodiments of the present disclosure. The memory sub-system 110 can include media, such as memory components 112-1 to 112-N. The memory components 112-1 to 112-N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112-1 to 112-N when the memory sub-system 110 is coupled with the host system 120 by the PCIe interface. The physical host interface can provide an interface for passing control, address, data, and other signals between the memory sub-system 110 and the host system 120.

The memory components 112-1 to 112-N can include any combination of the different types of non-volatile memory components and/or volatile memory components. An example of non-volatile memory components includes a Not-And (NAND) type flash memory. Each of the memory components 112-1 to 112-N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112-1 to 112-N can be based on any other type of memory such as a volatile memory. In some embodiments, the memory components 112-1 to 112-N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, as noted above, the memory cells of the memory components 112-1 to 112-N can be grouped as data blocks that can refer to a unit of the memory component used to store data. In some embodiments, the memory components 112-1 to 112-N can be embodied in an integrated circuit package, including but not limited to, a pin grid array (PGA), single in-line package (SIP), standard or non-standard dual in-line package (DIP), ceramic dual in-line package (CDIP), quadruple in-line package (QIP), skinny dual in-line package (SDIP), zig-zag in-line package (ZIP), ceramic column-grid array (CCGA), column-grid array (CGA), lead-less lead-frame package (LLP), land grid array (LGA), low-temperature co-fired ceramic (LTCC), multi-chip module (MCM), Micro surface-mount device extended technology (MICRO SMDXT), quad flat package (QFP), small outline package (SOP), ball grid array (BGA), and chip-scale package (CSP). Accordingly, the memory components 112-1 to 112-N can be inserted or otherwise attached to a substrate associated with the memory sub-system 110, wherein the substrate comprises an arrangement of a plurality of vias.

A memory sub-system controller 115 (hereinafter referred to as "controller") can communicate with the memory components 112-1 to 112-N to perform operations such as reading data, writing data, or erasing data at the memory components 112-1 to 112-N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112-1 to 112-N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112-1 to 112-N. The controller 115 can further include host interface circuitry to communicate with the host system 120 via the physical host interface. The host interface circuitry can convert the commands received from the host system into command instructions to access the memory components 112-1 to 112-N as well as convert responses associated with the memory components 112-1 to 112-N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112-1 to 112-N.

Figure 2:
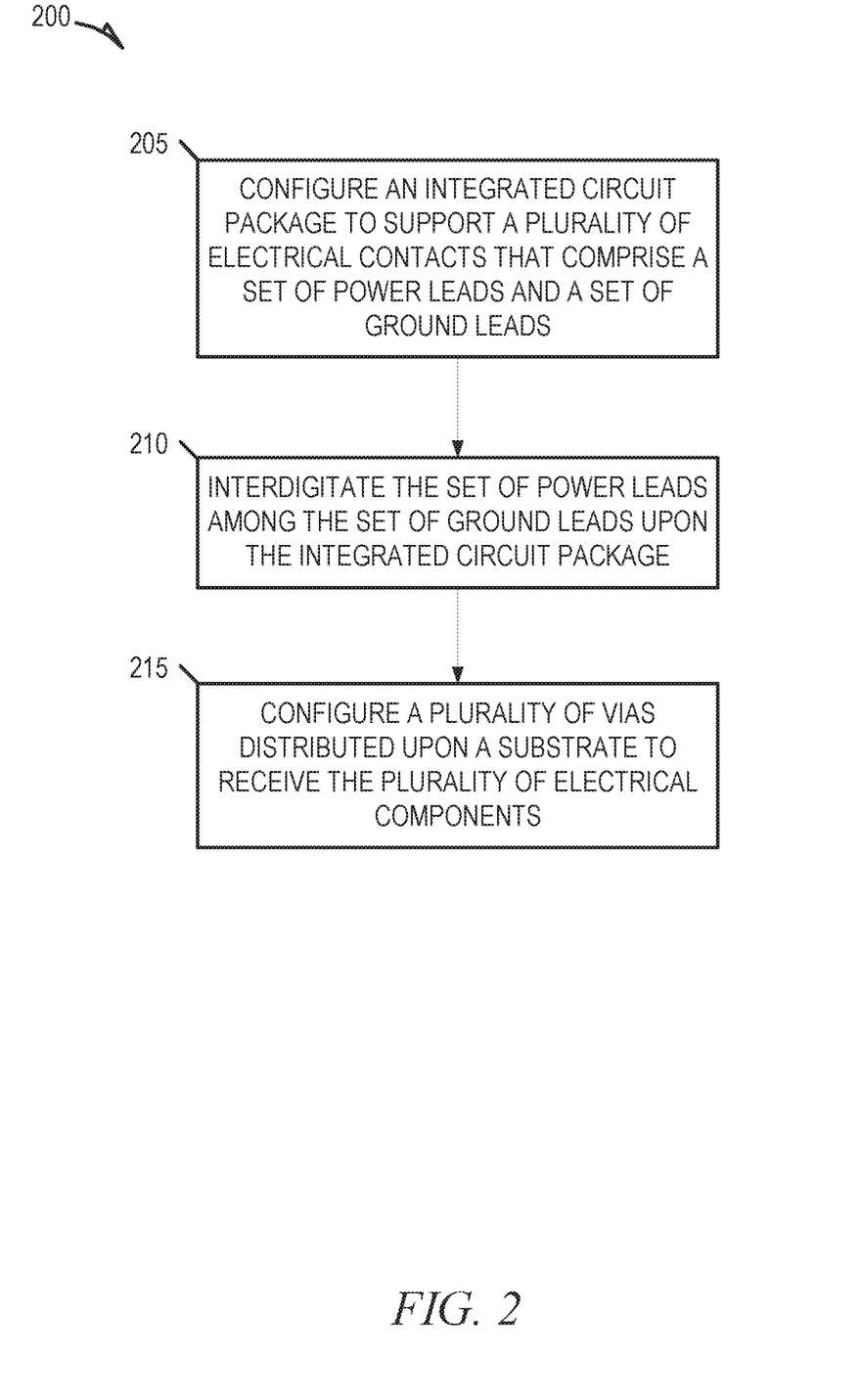
FIG. 2 is a flow diagram of an example method to reduce inductance on an integrated circuit package, in accordance with some embodiments of the present disclosure.

FIG. 2 is a flow diagram of an example method 200 to reduce inductance on an integrated circuit package, in accordance with some embodiments of the present disclosure. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, an integrated circuit package of the memory components 112-1 to 112-N, is configured to support a plurality of electrical contacts such as pins, or leads. For example, the integrated circuit package includes a BGA or PGA, wherein the plurality of electrical contacts comprise a set of power leads and ground leads.

Thereafter, at operation 210, the plurality of electrical contacts are arranged upon the integrated circuit package, such that the set of power leads are inter-digitated among the set of ground leads. As an illustrative example, consider a checkerboard, where black and white squares are arranged in an alternating pattern, such that a black square is always preceded and followed by a white square, and vice versa. Similarly, inter-digitating the power leads among the ground leads can include arranging the power leads and ground leads in a checkerboard pattern, such that a power lead is always preceded and followed by a ground lead, and vice versa.

In some embodiments, the leads can be grouped into power and ground pairs, such that pairs of leads are a first threshold distance from one another, and wherein each pair of leads is a second threshold distance from an adjacent pair of leads. The first threshold distance can be shorter than the second threshold distance.

As depicted in operation 215 of the method 200, a plurality of vias of a substrate are configured to accept the memory components 112-1 to 112-N, by arranging the vias in a matching inter-digitated pattern. For example, the plurality of vias comprise power vias and ground vias. Accordingly, the plurality of vias are arranged along the substrate such that the power vias are inter-digitated among the ground vias.

Figure 3A:
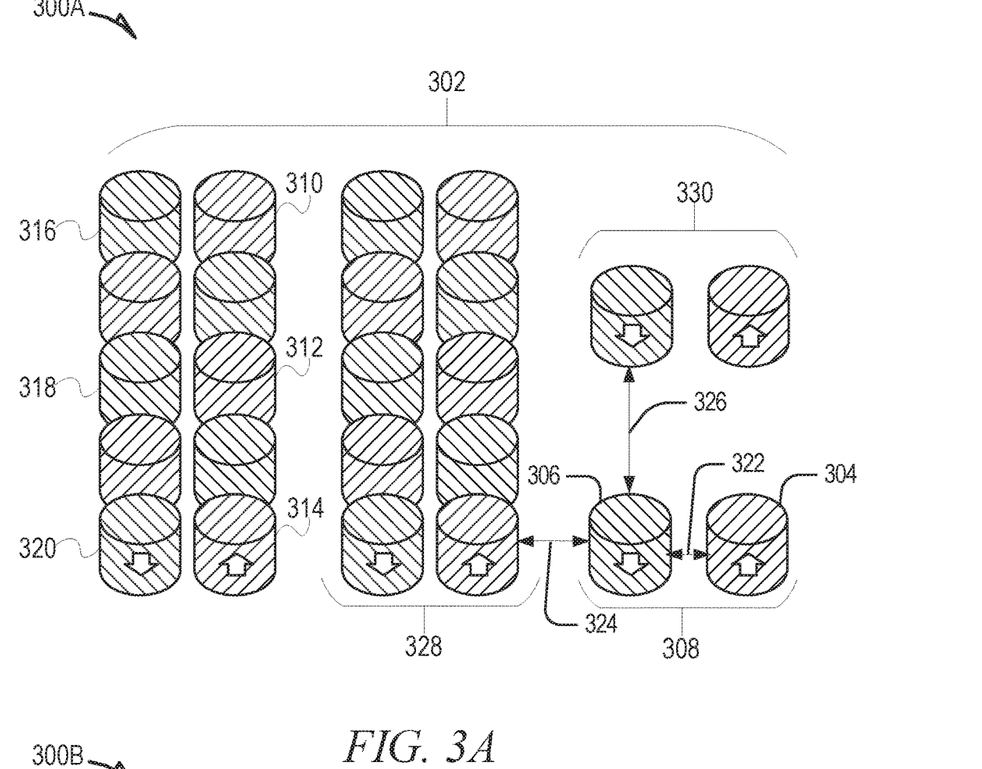
FIGS. 3A and 3B are diagrams depicting an inter-digitated pin arrangement, in accordance with some embodiments of the present disclosure.

FIG. 3A is a diagram 300A depicting an inter-digitated arrangement of leads 302 (hereinafter, "leads 302") of a memory component (e.g., the memory component 112), in accordance with some embodiments of the present disclosure. As seen in diagram 300A, the leads 302 comprise a set of power leads (e.g., power lead 304, power lead 310, power lead 312, power lead 314), and ground leads (e.g., ground lead 306, ground lead 316, ground lead 318, and ground lead 320). The leads 302 include electrical contacts distributed upon an integrated circuit package, such as a BGA or PGA.

According to certain example embodiments, and as seen in the diagram 300A, the leads 302 can be arranged in inter-digitated pairs of power and ground leads (e.g., pair 308), such that the power lead 302 is a first threshold distance 322 apart from the ground lead 306, and the pair 308 is a second and third threshold 324 and 326 apart from other pairs of leads (e.g., the pair 328 and the pair 330), wherein the first second and third threshold 322, 324, and 326 are all distinct values.

For example, the first threshold distance 322 that defines a gap between the power lead 304 and the ground lead 306 of the pair 308 can be configured to be as small as possible in order to minimize the inductance between the pair 308, while the second threshold distance and third threshold distance 324 and 326 are spaced to optimize for a reduction of cross-talk between any two lead pairs (e.g., the pair 328 and the pair 330), including adjacent lead pairs.

Figure 3B:
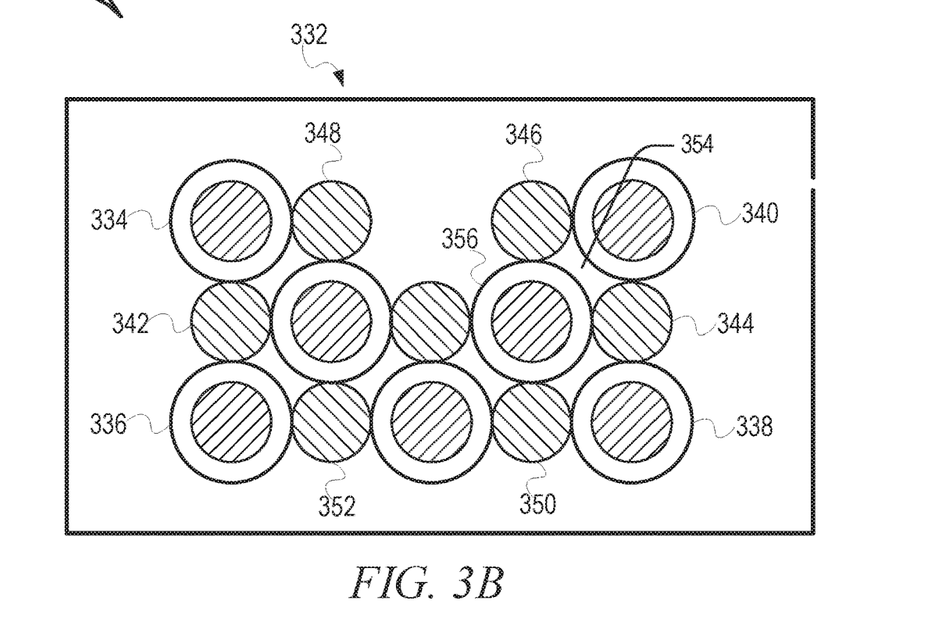

FIG. 3B is a diagram 300B depicting an inter-digitated arrangement of vias 332, in accordance with some embodiments of the present disclosure. As seen in diagram 300B, the vias 332 comprise a set of power vias (e.g., power via 334, power via 336, power via 338, power via 340, and power via 356), and ground vias (e.g., ground via 342, ground via 344, ground via 346, ground via 348, ground via 350, and ground via 352). The vias 332 can be arranged in an alternating, inter-digitated pattern, such as a checkerboard pattern along a substrate, and correspond with a plurality of leads, such as the leads 302.

According to certain example embodiments, the vias 332 can be arranged upon a substrate to maximize a size of a webbing 354 between power vias on the substrate. In such embodiments, the webbing 354 provides protection against shorts between the power vias, such as the power via 340 and the power via 356.

Figure 4:
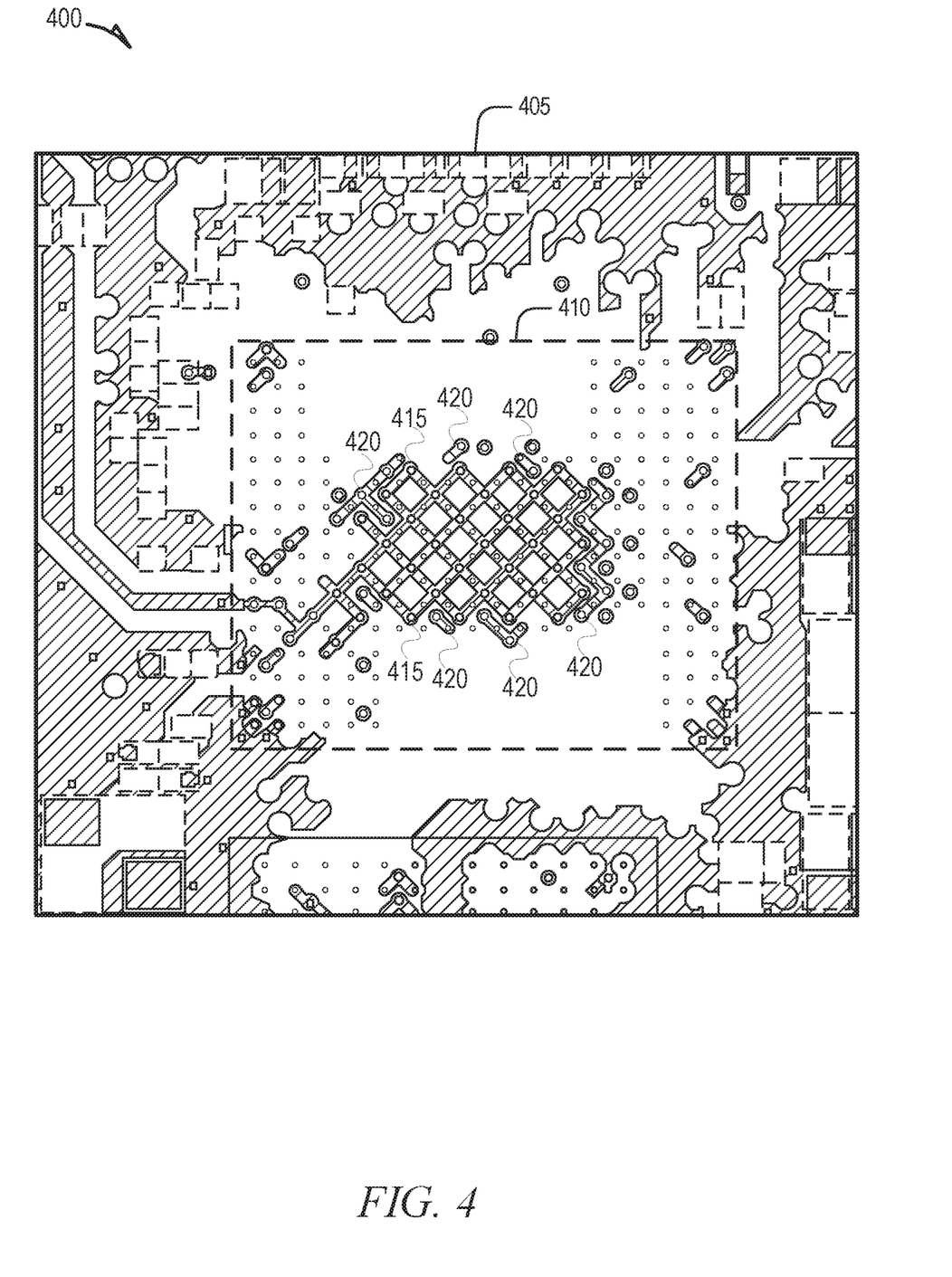
FIG. 4 is a diagram depicting a substrate layout, in accordance with some embodiments of the present disclosure.

FIG. 4 is a diagram 400 depicting a substrate layout 405, in accordance with some embodiments of the present disclosure. As seen in diagram 400, the substrate layout 405 comprises an inter-digitated arrangement of vias 410, configured to accept and reduce inductance on an integrated circuit package, such as a PGA or BGA. The inter-digitated arrangement of vias 410 of the diagram 400 includes an illustration of a pin routing between the vias, depicted as connectors between each point (via) among the inter-digitated arrangement of vias 410.

As seen in the diagram 400, the inter-digitated arrangement of vias 410 can be similar to the vias 332, depicted in FIG. 3B, wherein the arrangement of vias 410 comprises an alternating and inter-digitated distribution of power and ground vias, and is configured to receive a set of inter-digitated leads, such as the leads 302 depicted in FIG. 3A.

As seen in the diagram 400, a plurality of ground vias 415 can be arranged upon the substrate layout 405, such that a plurality of power vias 420 are inter-digitated among the plurality of ground vias 415, such that a power via is always preceded and followed by a ground via.

Figure 5:
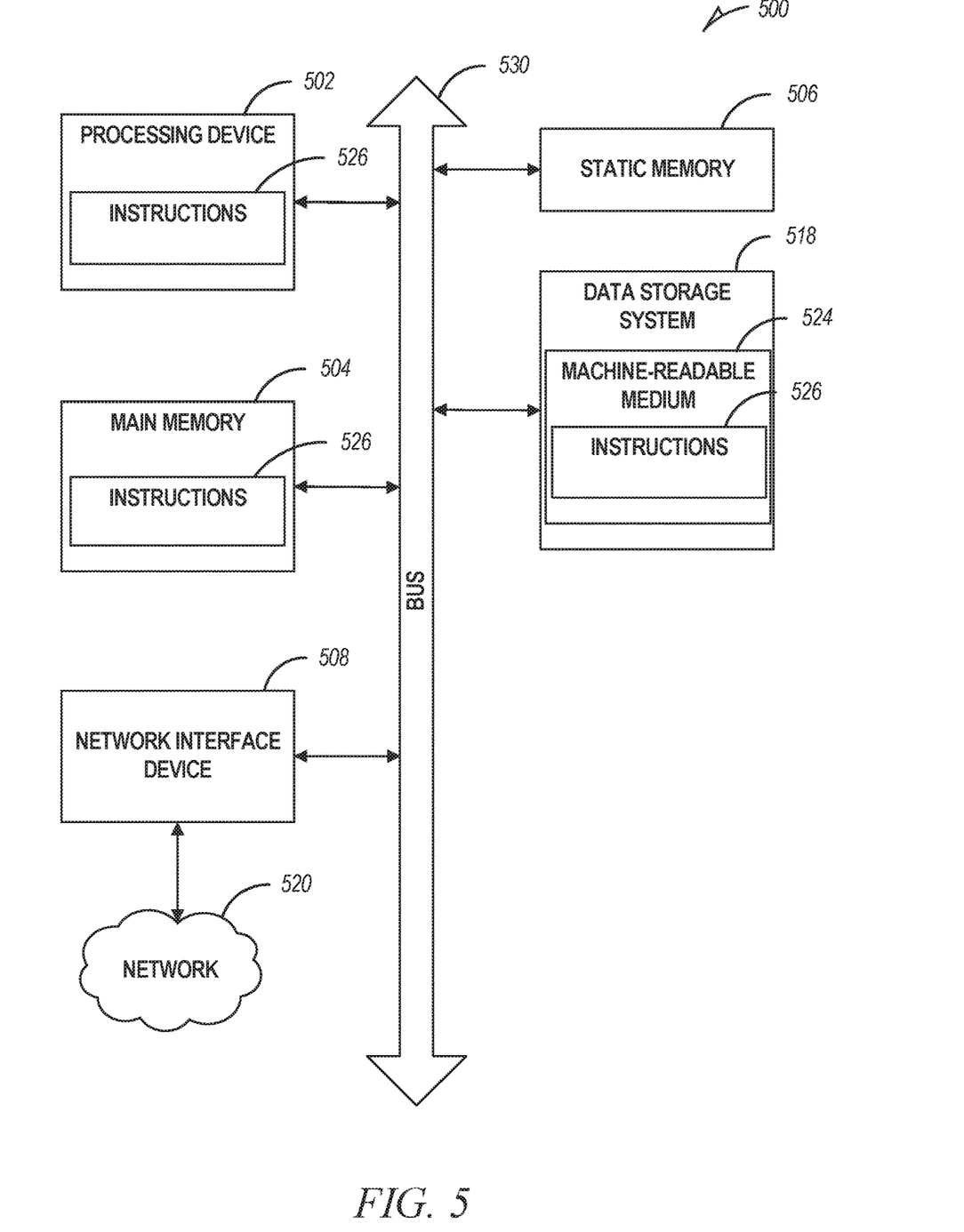
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller. In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an ASIC, a FPGA, a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and the like.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

EXAMPLES

Example 1 is a system comprising: a substrate material; and a plurality of memory components positioned upon the substrate material, each of the plurality of memory components comprising: a package that supports an arrangement of a plurality of electrical contacts; the plurality of electrical contacts comprising a set of power pins and a set of ground pins; and the arrangement of the plurality of electrical contacts comprising the set of power pins inter-digitated among the set of ground pins.

In Example 2, the subject matter of Example 1, wherein the substrate material comprises a plurality of vias that correspond with each of the plurality of electrical contacts of the package, the plurality of vias including a set of power vias and a set of ground vias.

In Example 3, the subject matter of Examples 1 and 2, wherein the arrangement of the plurality of electrical contacts is a first arrangement, the substrate material comprises a second arrangement of the plurality of vias, and the second arrangement of the plurality of vias comprises the set of power vias inter-digitated among the set of ground vias.

In Example 4, the subject matter of Examples 1, 2, and 3, wherein the arrangement of the plurality of electrical contacts is a first arrangement, the substrate material comprises a second arrangement of the plurality of vias, and the second arrangement of the plurality of vias includes pairs that comprise a power via and a ground via situated a first distance from one another, wherein each pair is a second distance from another pair.

In Example 5, the subject matter of Example 1, wherein the arrangement of the plurality of electrical contacts further comprises: an alternating pattern that comprises a power pin from among the set of power pins and a ground pin from among the set of ground pins.

In Example 6, the subject matter of Example 1, wherein the package includes a pin grid array.

In Example 7, the subject matter of Example 1, wherein the arrangement of the plurality of electrical contacts comprises gaps of a minimum thickness between each contact among the plurality of electrical contacts.

Example 8 is a method of reducing inductance on an integrated circuit package comprising: configuring the integrated circuit package to support a plurality of electrical contacts that comprise a set of power pins and a set of ground pins; and arranging the plurality of electrical contacts upon the integrated circuit package such that the set of power pins are inter-digitated among the set of ground pins.

In Example 9, the subject matter of Example 8, wherein the method further comprises: preparing a substrate to receive the integrated circuit package, the preparing the substrate including: orienting a plurality of vias that correspond with each of the plurality of electrical contacts of the integrated circuit package upon the substrate, the plurality of vias including a set of power vias and a set of ground vias.

In Example 10, the subject matter of Examples 8 and 9, wherein the set of power vias are inter-digitated among the set of ground vias along the substrate.

In Example 11, the subject matter of Examples 8, 9, and 10, wherein the orienting the plurality of vias further comprises: arranging one or more pairs of power and ground vias at positions along the substrate, the positions of the one or more pairs of power and ground vias being situated a threshold distance from one another.

In Example 12, the subject matter of Example 8, wherein the arrangement of the plurality of electrical contacts further comprises: an alternating pattern of power pins and ground pins.

In Example 13, the subject matter of Example 8, wherein the integrated circuit package includes a pin grid array.

In Example 14, the subject matter of Example 8, wherein the arrangement of the plurality of electrical contacts comprises one or more gaps between each of the plurality of electrical contacts, the one or more gaps comprising a minimum distance.

Example 15 is a non-transitory computer-readable storage medium comprising: a plurality of memory components, each of the plurality of memory components comprising: a package that supports an arrangement of a plurality of electrical contacts; the plurality of electrical contacts comprising a set of power pins and a set of ground pins; and the arrangement of the plurality of electrical contacts comprising the set of power pins inter-digitated among the set of ground pins.

In Example 16, the subject matter of Example 15, further comprising a substrate material that comprises a plurality of vias that correspond with the plurality of electrical contacts, the plurality of vias including a set of power vias and a set of ground vias.

In Example 17, the subject matter of Examples 15 and 16, wherein the arrangement of the plurality of electrical contacts is a first arrangement, the substrate material comprises a second arrangement of the plurality of vias, and the second arrangement of the plurality of vias comprises the set of power vias inter-digitated among the set of ground vias.

In Example 18, the subject matter of Example 15, wherein the arrangement of the plurality of electrical contacts further comprises: an alternating pattern that comprises a power pin from among the set of power pins and a ground pin from among the set of ground pins.

In Example 19, the subject matter of Example 15 wherein the package includes a pin grid array.

In Example 20, the subject matter of Example 15, wherein the arrangement of the plurality of electrical contacts comprises gaps of a minimum thickness between each contact among the plurality of electrical contacts.

What is claimed is:

1. A system comprising:
a substrate material; and
a plurality of memory components positioned upon the substrate material, each of the plurality of memory components comprising:
a package that supports an arrangement of a plurality of electrical contacts;
the plurality of electrical contacts comprising a set of power leads and a set of ground leads, the set of power-leads inter-digitated among the set of ground leads; and
the arrangement of the plurality of electrical contacts comprising paired groupings of electrical contacts that include at least a first paired grouping and a second paired grouping, each paired grouping including a power lead and a ground lead situated a first distance from one another, and wherein the first paired grouping is a second distance from the second paired grouping, the second distance being greater than the first distance.

2. The system of claim 1, wherein the substrate material comprises a plurality of vias that correspond with each of the plurality of electrical contacts of the package, the plurality of vias including a set of power vias and a set of ground vias.

3. The system of claim 2, wherein the arrangement of the plurality of electrical contacts is a first arrangement, the substrate material comprises a second arrangement of the plurality of vias, and the second arrangement of the plurality of vias comprises the set of power vias inter-digitated among the set of ground vias.

4. The system of claim 2, wherein the arrangement of the plurality of electrical contacts is a first arrangement, the substrate material comprises a second arrangement of the plurality of vias, and the second arrangement of the plurality of vias includes pairs that comprise a power via and a ground via situated a threshold distance from one another, the threshold distance calculated to minimize an inductance value between the power lead and the ground lead.

5. The system of claim 1, wherein the arrangement of the plurality of electrical contacts comprises:
a plurality of electrical contacts that comprise pairs of power leads and ground leads, the pairs of power leads and ground leads comprising at least a first pair; and
the first pair of electrical contacts comprising a power lead and a ground lead situated a threshold distance from one another upon the package, the threshold distance calculated to minimize an inductance value between the power lead and the ground lead.

6. The system of claim 1, wherein the arrangement of the plurality of electrical contacts further comprises:
an alternating pattern that comprises a power lead from among the set of power leads and a ground lead from among the set of ground leads.

7. The system of claim 1, wherein the package comprises a ball grid array.

8. The system of claim 1, wherein the plurality of electrical contacts include a ball-grid array.

9. The system of claim 1, wherein the plurality of electrical contacts include a pin-grid array.

* * * * *